United States Patent [19]  [11] 4,449,118
Dingwall et al.  [45] May 15, 1984

[54] SWITCHING CIRCUITRY AS FOR A FLASH A/D CONVERTER

[75] Inventors: Andrew G. F. Dingwall, Bridgewater; Victor Zazzu, Montvale, both of N.J.

[73] Assignee: RCA Corporation, New York, N.Y.

[21] Appl. No.: 326,153

[22] Filed: Nov. 30, 1981

[51] Int. Cl.³ .................. H03K 13/02; H03K 13/175
[52] U.S. Cl. ........................... 340/347 AD; 307/450; 307/451; 340/347 M
[58] Field of Search ................... 340/347 M, 347 AD; 307/450, 451

[56] References Cited
U.S. PATENT DOCUMENTS
3,676,702  7/1972  McGrogan, Jr. .................. 307/235

OTHER PUBLICATIONS
"CMOS/SOS Flash ADC Speeds on Low Power for Low Cost", M. Glincman, Electronic Design, Nov. 22, 1980, pp. 227-231.

Primary Examiner—T. J. Sloyan
Attorney, Agent, or Firm—E. M. Whitacre; J. S. Tripoli; E. P. Herrmann

[57] ABSTRACT

A flash type A/D converter has a plurality of transistor switch means for alternately connecting respective ones of a plurality of reference potentials or input signal to a plurality of summing capacitors each serially connected to a self biased inverter (comparator) circuit. Certain ones of the switches are configured to operate in the source follower mode to preclude excessive capacitor discharging when extremes of input signal are applied. This reduces the current required to recharge the capacitors by the reference potential source and tends to limit loading affects on the reference source. In addition certain ones of the switch transistors have their turn on or threshold potentials tailored to effectively reduce feedthrough between the respective switch control electrodes and the capacitor-switch interconnection.

12 Claims, 4 Drawing Figures

SWITCHING CIRCUITRY AS FOR A FLASH A/D CONVERTER

This invention relates to flash analog-to-digital (A/D) converters and in particular to comparator circuitry for a "flash" type A/D converter.

The flash type A/D converter simultaneously compares an input signal to a large number of reference potentials. A six bit converter with overflow requires $2^6$ or 64 simultaneous comparisons, an eight bit converter requires 256 comparisons. In order to realize the flash converter with manageable circuitry, i.e., to make it economically practical, relatively simple comparator circuits are utilized. One circuit that has been employed with success at least for six bit converters is described in U.S. Pat. No. 3,676,702 issued to E. P. McGrogan, Jr. and entitled "Comparator Circuit". The McGrogan, Jr. circuit alternately switches first a reference potential, then a signal potential to the first plate of a summing capacitor. The second plate of the summing capacitor is connected to the input of an inverter circuit which is selectively biased at its trip point or threshold potential each time the reference potential is applied. Very small differences between the input signal and the reference signal can accurately be determined, i.e., an input signal very slightly greater (lesser) than the reference signal will cause the inverter to trip negative (positive).

The McGrogan, Jr. circuit utilizes complementary transmission gates comprised of complementary field effect transistors (FETs) to alternately apply reference potential or signal potential to the summing capacitor. Complementary transmission gates ostensibly tend to reduce the amount of switch pulse potential coupled to the summing capacitor via stray or otherwise unavoidable capacitances inherent in the switching transistors (gates). Each complementary gate comprises an N-type FET and a P-type FET connected in parallel with their respective control electrodes concurrently energized with complementary signals of equal amplitude. All things being equal any switching pulse signals coupled to the signal circuitry by one transistor will be compensated or eliminated by coupling due to the other transistor.

Circuit measurements of existing flash A/D converters of this type tend to indicate that in fact switching pulse signals are not completely cancelled and result in charge accumulating on the summing capacitor. This may result from "charging pumping", i.e., the FET switch inversion layer charge being dispersed to the substrate and FET drain electrodes when the transistor is turned off or to the existence of non-equal gate-drain capacitance between the self-compensating transistors. In the latter case the gate switching voltage is coupled to the drain electrode by gate-drain overlap capacitance and the drain-substrate depletion capacitance beneath the gate electrode. To overcome the latter two effects the present inventors selectively dope the underlying FET switch silicon substrate to (a) lower the transistor turn on potential and (b) increase the inversion layer charge. The inversion layer tends to shield the FET drain region from capacitive coupling between gate and drain since the inversion layer is essentially shorted to the FET source electrode which in turn is connected either to the input connection or a reference potential connection. The drain electrode is not affected by the gate potential transition until the gate potential falls below threshold and the inversion layer collapses. By the time this occurs the gate potential excursion is substantially complete and the residual swing has little effect on the drain potential. In respect to the charge pumping phenomena, a more lightly doped substrate tends to enhance the bulk depletion width and in turn retard inversion layer conduction into the substrate thereby reducing modulation of the drain electrode.

A second factor which imposes a sensitivity limitation on the flash converter arises from current loading the reference ladder. Consider the input signal to be low. Application of this signal during the comparison cycle essentially discharges all the summing capacitors. Subsequent recharging of the summing capacitors during the next system cycle tends to load the ladder and substantially increase the cycle time of the converter or for a fixed cycle time reduce the sensitivity of the converter.

The summing capacitor charging current is limited by arranging the transmission gates between the signal input terminal and the summing capacitor to operate in the source follower mode, i.e., the gates which are located so as to operate with reference potentials near either of the supply potential extremes. Operation in the source follower mode precludes the transistor from discharging the capacitor below the transistor threshold potential, thus retaining a residual charge that need not be recharged in the subsequent cycle.

SUMMARY OF THE INVENTION

In order to reduce transient charging effects in a flash A/D converter to the afore described type, the comparator transmission gate structure is tailored relative to the reference potential corresponding to a particular gate position on the potential reference ladder. Transmission gate structures operative in the lower reference potential range comprise two parallel connected N-type transistors having their control electrodes energized with complementary signals. One of the transistors has its drain left unconnected so that that switch is not closed all the time. Both transistors have a drain/source connection at the summing capacitor.

Transmission gates operatively connected to potentials which exceed the normal N-type threshold potential, e.g., about 1 volt to about 2 volts, comprise a complementary pair of transistors with the drain electrode of the respective P-type transistors left unconnected. The threshold voltage of the respective N-type transistors is lowered by reduction of the respective substrate doping concentration.

At the midrange of the reference potential resistive ladder the transmission gates are complementary structures with both N and P-type transistors connected for conduction. The substrate doping concentration for the N-type transistors is lowered similarly to the foregoing N-type devices, thereby producing a lower N-type transistor threshold voltage.

Transmission gates located in the range of most positive reference potentials comprise parallel connected P-type transistors. The drain electrode of one of the P-type transistors is left unconnected and the control electrodes of the two transistors are energized with complementary switching signals. In between these and the midrange devices the transmission gates comprise parallel connected complementary devices with the drain electrode of the N-type transistor left unconnected. The doping concentration of the silicon substrate for the N-type transistor in this grouping of transmission gate structures is lowered similarly to the foregoing n-type devices.

BRIEF DESCRIPTION OF THE DRAWINGS

Referring to FIG. 1, a representative flash A/D converter is shown which is capable of producing the parallel eight bit binary output signal A$\phi$ to A7. The eight bit output signal translates to apportioning the maximum permitted input signal (i.e., the operable input voltage range) into 256 or $2^8$ ascending values. This is accomplished by applying a known voltage (10) across a linear resistor (20) and tapping the potential dropped across the resistor (20) at 256 equally spaced intervals. Each of the resistor taps from 1 to 256 exhibits incrementally increasing reference voltages. The signal input voltage is compared to each of the tap reference voltages by 256 comparators (15) operating in parallel. The output of all of the comparators connected to reference taps having a voltage value less than the input potential will exhibit one output state and the remaining comparators will exhibit a second output state.

The comparators (15) are clocked to sample or compare the input signal at prescribed intervals. At the end of a sampling period the output states of the comparators are latched into 256 respective parallel latch circuits (16).

The latched output signals are applied to 255 parallel three-input AND circuits (17). Each of the AND circuits examines triplets of successive ascending comparator states. The respective AND circuits will produce an output signal only for the condition that two adjacent latches connected are exhibiting a logical "high" output state and the next ascending latch is exhibiting a logical "low" output state. By employing this arrangement only one of the 255 AND circuits will produce an output signal for a given input sample.

The output terminals of the AND circuits (17) are applied to a programmable logic array or PLA (18) which produces a parallel eight bit binary output signal A$\phi$–A7 related to the particular AND circuit currently exhibiting an output signal.

Figure 1:
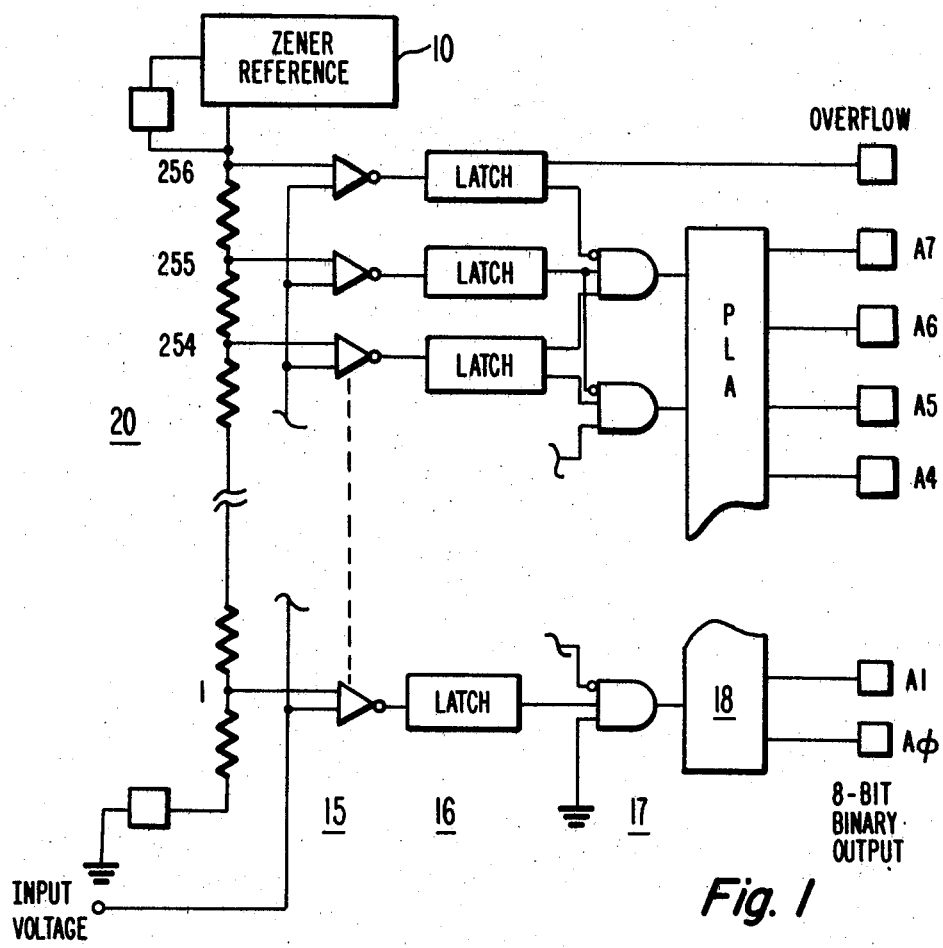
FIG. 1 is a block diagram of an 8 bit flash A/D converter.
Figure 2:
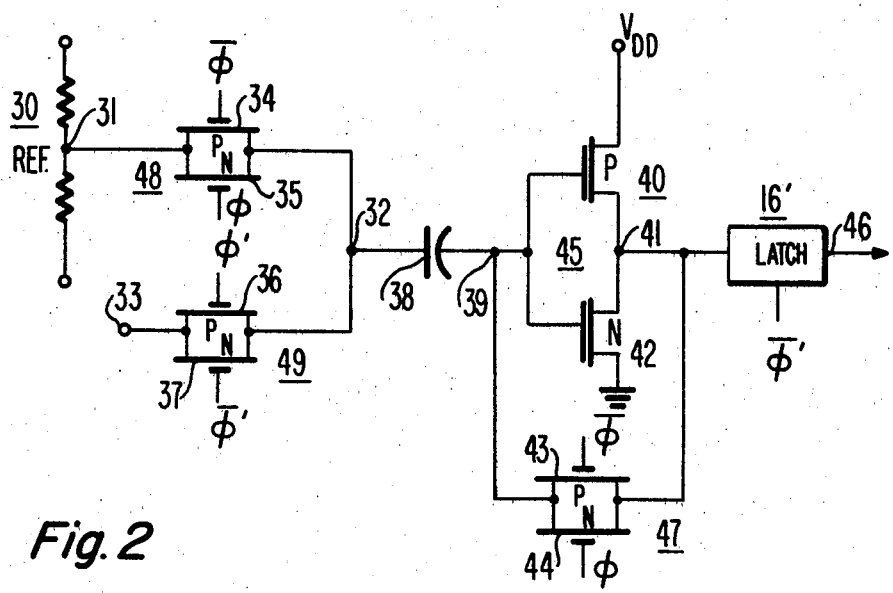
FIG. 2 is a schematic diagram of one comparator circuit realized in FET circuitry for utilization in a fhash A/D converter.

FIG. 2 illustrates generally the comparator circuits employed in the A/D converter. Resistor 30 represents a portion of the reference potential dividing resistor or ladder 20 (FIG. 1). A particular one of the 256 reference potentials is available at point 31.

The comparator includes a complementary symmetry or CMOS inverter 45 comprising P-type semiconductor 40 and N-type semiconductor 42 transistors connected in series between positive potential V$_{DD}$ and ground. A complementary transistor switch 47 including P-type transistor 43 and N-type transistor 44, responsive to control signals $\bar{\phi}$ and $\phi$ respectively, selectively connects the inverter output terminal 41 to the inverter input terminal 39. This self-biases the inverter at its mid or switch point. The bias potential is stored on the summing capacitor 38.

During the period the inverter 41 output potential is fed back to the input terminal 39 and capacitor 38, a second complementary transistor switch 48 comprising P-type transistor 34 and N-type transistor 35 respectively responsive to control signals $\bar{\phi}$ and $\phi$ selectively connects the reference potential at point 31 to node 32 located on the other side of the summing capacitor 38. Switches 47 and 48 then turn off leaving the inverter 45 biased at its switch point and with the reference potential stored on node 32.

Immediately thereafter the third complementary transistor switch 49 including P-type transistor 36 and N-type transistor 37 respectively responsive to control signals $\phi'$ and $\bar{\phi}'$ connects the input signal at terminal 33 to node 32. If the input signal is greater or lesser than the reference potential, the potential difference is coupled across the summing capacitor 38 to the inverter input connection 39. The gain of the inverter is sufficiently high that the slightest deviation applied to the self bias potential will cause the output to switch to either a "high" output state (Vin less than Vref) or a "low" output state (Vin greater than Vref). The output state is applied to the input of LATCH 16' which stores the output state responsive to control signal $\bar{\phi}'$ going low.

The foregoing circuit and operational description comprises one complete signal sampling cycle of the comparator circuitry. The inverter self biases itself during every cycle which tends to eliminate stability problems due to parameter drifts. The control signals $\phi$ and $\bar{\phi}$ are complementary signals. Control signals $\phi'$ and $\bar{\phi}'$ are generally complementary signals substantially identical in duration and phase with signals $\phi$ and $\bar{\phi}$ respectively. Typically, the duration of these signals is designed to allow switches 47 and 48 to open before switch 49 closes, however the system is operable even with a small degree of pulse overlap.

In the present invention respective comparator switches corresponding to switches 48 and 49 have been modified to reduce undesirable switching effects which tend to reduce system sensitivity.

Figure 3:
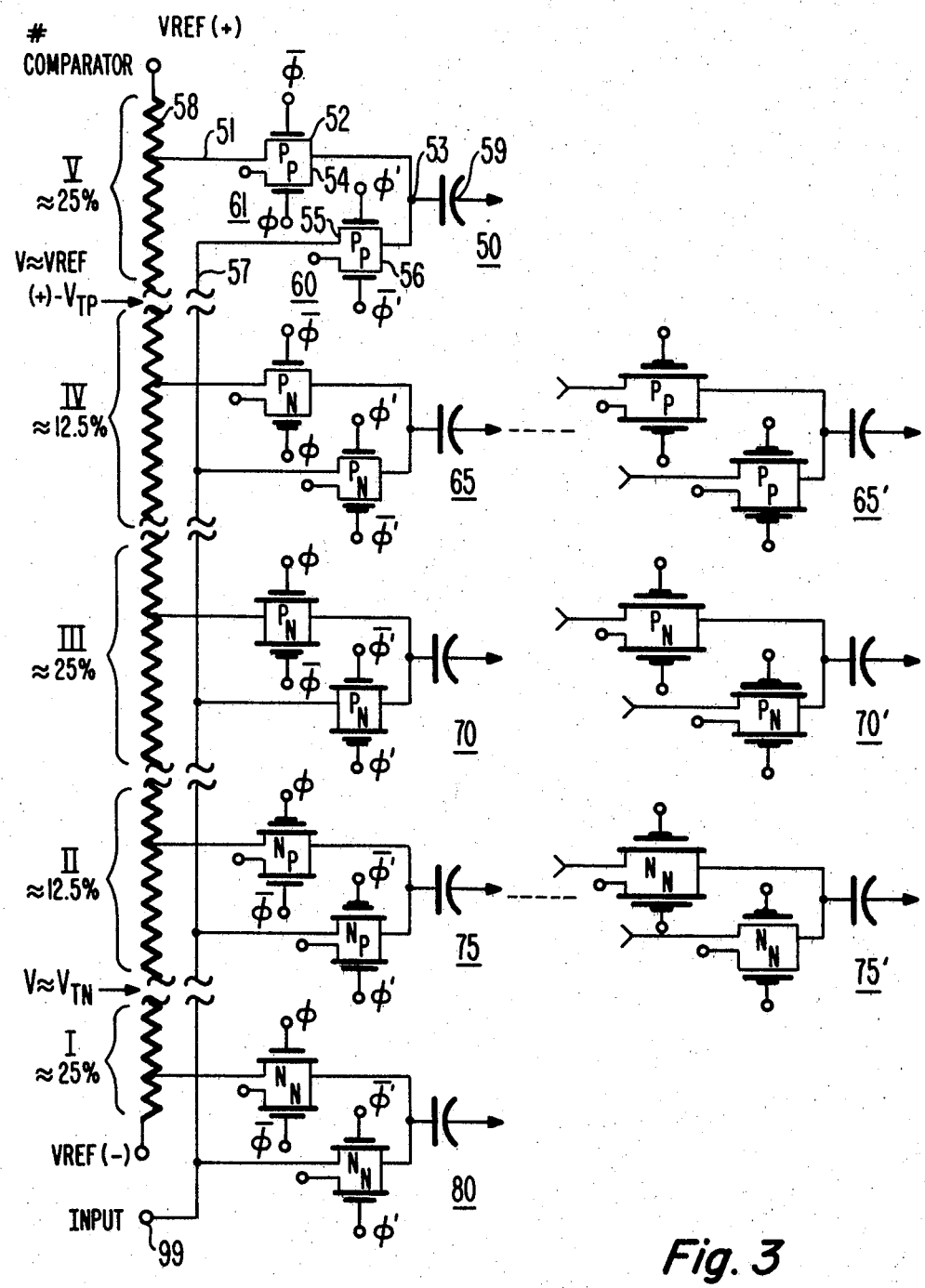
FIG. 3 is a schematic diagram of an arrangement of comparator transmission gates embodying the present invention tailored to enhance flash A/D converter performance.

FIG. 3 illustrates in part the comparator switches embodied in a flash type A/D converter. Respective switches corresponding to particular comparators are tailored to the range of reference potentials to which they are connected. In the figure the reference potentials are divided into five groups or ranges. For descriptive purposes assume that the potentials V$_{REF}$(−) and V$_{REF}$(+) applied to opposite ends of the resistance reference ladder correspond to ground and V$_{DD}$ which potentials correspond to the amplitudes of the bilevel control signals applied to gate electrodes of the switching transistors. Further assume that the normal circuit transistors are enhancement mode devices having threshold or turnon potentials of (±) V$_T$, e.g., 1 volt. The range of reference potentials for Group I is from ground to slightly greater than V$_{TN}$, the normal threshold potential for an N-type enhancement transistor. Similarly the range of the group V reference potentials is from V$_{DD}$ to (V$_{DD}$−V$_{TP}$) where V$_{TP}$ is the normal threshold potential for a P-type enhancement transistor. The group III range extends equidistantly on either side of V$_{DD}$/2 and has arbitrarily been chosen to include 25 percent of V$_{DD}$ potential or more precisely 25 percent of (V$_{Ref}$(+)V$_{REF}$(−).

Groups II and IV fill the gaps between Groups I and III and Groups III and V. For the particular example shown it was assumed that V$_{REF}$(+) minus V$_{REF}$(−) is 5 volts and the circuit is an 8 bit converter, i.e., there are a total of 256 comparators or 256 sets of switches. Considering these specifications Groups I, III and V each contain 25 percent of the 256 sets of switches and Groups II and IV each contain 12½ percent of the 256 switches. Note these are approximate values.

To appreciate the reasons for selecting the switch pair configuration of each switch set, assume that each transistor switch pair comprises a complementary switch pair similar to FIG. 2 switch 49. Normally one transistor operates as a source follower and the other as a common source transistor depending on the potentials applied to the parallel connected source and drain electrodes. Now consider such switches operating in Groups IV and V with switch set 50 as a representative example. Assume transistor 55 is an N-type device. Further assume that the input signal on terminal 99 is low. When transistor 55 (N-device) turns on it will discharge node 53 completely to the input voltage. Subsequently when reference potential is connected to node 53 via conduction of transistor 52, capacitor 59 must be completely recharged. This requires a relatively large current to be conducted in the resistor ladder 58. Since the capacitors corresponding to each of the switch sets in Groups IV and V are subject to this discharge-charge cycle, in the aggregate, the charging current tends to momentarily load the resistor ladder 58 and affect the accuracy and the maximum operating speed of the circuit. This is a significant factor where it is desired to sample at 4 to 6 times the video bandwidth.

Next consider the switch 60 as configured in FIG. 3, i.e., with transistors 55 being a P-type device. Again assume that the input signal is low and node 53 has been recharged to its respective reference voltage. Under these bias conditions the transistor 55 electrode connected at node 53 will operate as a source electrode and transistor 55 will effectively operate as a source follower. Transistor 55 will turn off when node 53 discharges to the threshold potential of the p-type transistor 55 leaving a significant residual charge on capacitor 59. Subsequently when node 53 is recharged to reference potential significantly less charging current is required, lessening the loading conditions on the ladder.

The switch pairs 60 and 61 in switch set 50 each comprise two P-type transistors, one transistor in each pair having its source/drain electrode disconnected in the circuit. This is necessary because the gate electrodes of each transistor pair are driven with complementary signals to cancel switching signal coupling to the summing capacitor 59. If both transistors of the respective switch pairs of the switch sets 50 were connected in the circuit the switches would never open as one or the other of the transistors would always be conducting.

The switch sets 80 in Group I have no P-type transistors for similar reasons. In this group the reference potentials are relatively low. For input signals that are high, i.e., near the $V_{REF}(+)$ potential, P-type transistors would charge the summing capacitors to input potential requiring a subsequent discharge to the respective reference values. The aggregate discharging current would tend to load the resistor ladder. On the other hand N-type transistors connected between the input terminal and the summing capacitors operate as source followers under these bias conditions. The maximum potential applied to the summing capacitor is limited to the gate potential minus $V_{TN}$ the N-type transistor threshold potential, thereby reducing the potential that must be subsequently discharged, and the loading effects on the ladder.

Because the respective reference potentials in the Group I and Group II ranges are relatively low, the N-type switch transistors will conduct relatively heavily. Similarly because the respective reference potentials in the Group IV and Group V ranges are relatively high, the P-type switch transistors will conduct relatively heavily. On the other hand at midrange, i.e., Group III, large input signals will limit conduction in P-type transistors, and low input potentials will tend to limit conduction in N-type transistors, thus it is desirable to implement the switch pairs with complementary transistors.

Typically N-type transistors generate larger gate-drain feed-through coupling than P-type transistors. The present inventors found that by lowering the threshold potential of the N-type devices the transistor gate-drain feedthrough is reduced. This may be appreciated by reference to FIG. 4.

Figure 4:
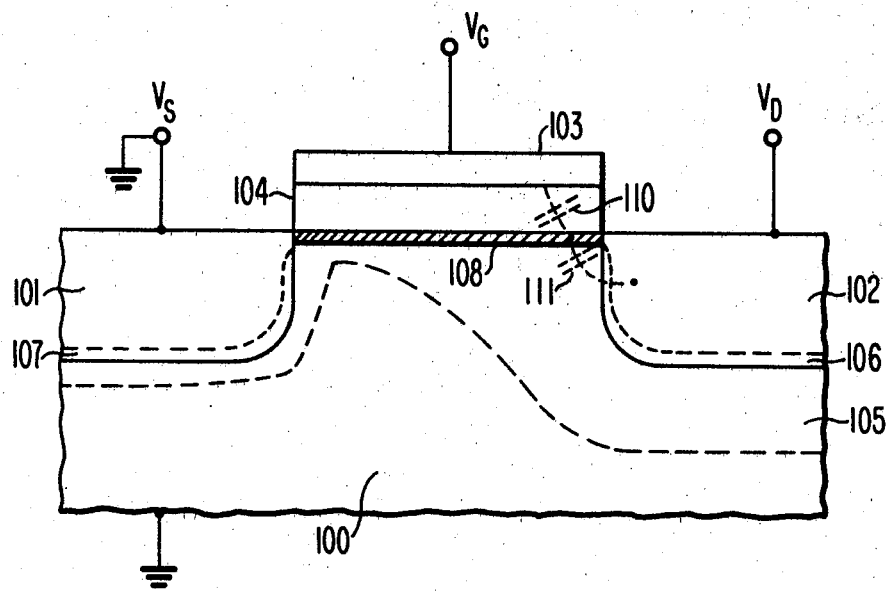
FIG. 4 is a representative drawing of the profile of an insulated gate field effect transistor.

FIG. 4 illustrates, in profile, a metal-oxide-semiconductor (MOS) transistor in the one state. Source (101) and drain (102) regions of a first conductivity type are diffused or implanted in a bulk substrate (100) of complementary conductivity. A dielectric material (104) is disposed over the substrate between the source and drain regions. A gate electrode 103 is disposed over the dielectric material (104). It is desirable that the edges of the gate electrode do not overlap the source and drain regions to minimize gate-drain coupling. As is well known a depletion region (105) will form in the substrate adjacent the junction of opposite conductivity type semiconductor materials, the width of the depletion layer depending on the potential applied across the junction and the relative concentration of P and N-type atoms in the respective regions. Similarly depletion layers 107 and 106 form in the source and drain regions respectively.

The depletion layers do not contain mobil charge carriers and thus exhibit a capacitance thereacross. The gate electrode 103, dielectric 104 and semiconductor surface form a capacitor a portion 110 of which is serially coupled with the substrate depletion layer capacitance (111) to the drain electrode (102). As potential is applied to the gate electrode in a direction to turn on the transistor, a portion of this potential is coupled to the drain region via the serially connected transistors. When the gate potential reaches the transistor turn on or threshold level, a layer of charge carriers (108) (inversion layer) forms between the source and drain regions at the dielectric-substrate interface. The impedance of this layer is much less than that of the coupling capacitors and tends to inhibit further gate-drain coupling. In effect the drain is shorted to the source and unaffected by coupling via the relatively small capacitances.

As the transistor is turning off, the gate potential excursion is not coupled to the drain until the inversion layer disperses, which occurs when the gate potential drops to the threshold value. The gate potential excursion between the threshold potential and ground is thereafter partially coupled to the drain electrode. It is readily appreciated that lowering the threshold potential will tend to lower the portion of the gate potential swing coupled to the drain.

It is known that as the reverse bias between the source region and substrate increases the effective threshold potential of the transistor increases. This condition obtains for N-type switch transistors in upward ascending positions of the ladder and for P-type switch transistors in downward descending positions of the ladder. Thus N-type transistors in Group III would tend to exhibit greater gate-drain feedthroughs than Group II N-type transistors than Group I N-type transistors, etc.

To reduce the feedthrough enhanced by this substrate effect, the threshold potential of the N-type transistors is lowered in switch sets connected to reference potentials greater than the normal N-type enhancement mode threshold potential (e.g., about 1 volt). It has been found that the threshold adjustment may place the N-type transistors slightly in the depletion mode without deleterious leakage effects.

Because of the normally lower gate-drain feedthrough of the P-type transistors, it was found unnecessary to adjust the threshold potential of the P-type transistors for switch sets connected to reference potentials less than $V_{REF}(+)$ minus $V_{TP}$, at least for an 8 bit A/D converter. However, for greater resolution such adjustment may be necessary.

Referring again to FIG. 3 it is noted that the compensating transistors in Groups I, II, IV and V have their respective source/drain electrodes connected to the respective summing capacitors. This is to effect feedthrough cancellation at the summing capacitor. It is presumed that the signal input impedance is sufficiently low that feed through to the input terminal will not affect the input signal for a significant portion of the sampling period. The same considerations apply to the connections to the reference ladder.

In the Figure the transistor source and drain electrodes are not designated as such since neither is connected to the substrate. Thus, depending on the applied input signal, source-drain regions may change roles as MOS transistors are bidirectional conduction devices. Transistors drawn with a conventional gate symbol are normal enhancement mode devices substantially as implemented in conventional CMOS circuitry. Transistors having a darkened rectangle drawn on the gate electrode are devices which have threshold potentials which have been lowered in value by reducing the impurity concentration in the adjacent substrate as is known in the semiconductor processing arts. Note that reducing the substrate impurity concentration in an integrated array requires added processing and thereby added expense. This tends to preclude grading the thresholds of the devices from one end of the ladder to the other. However, it has been found that for an eight bit device a uniform threshold reduction for all of the N-type switch transistors in Groups II, III and IV was sufficient to produce the required resolution.

The transistor switch pairs in the Group II range comprise complementary devices with the N-type transistor channels connected for conduction. One side of the P-type transistor channels was left disconnected, though connection of this electrode would probably not affect performance. An alternate arrangement for the Group II switch sets 75 is shown as switch set 75' wherein both transistors in a switch pair are N-type devices. Here, however, the conduction channel of one transistor in each pair must remain disconnected.

The transistor switch pairs in the Group IV range comprise a complementary pair of transistors with the N-type transistor disconnected on the input side. The N-type transistor could probably be connected in parallel with the P-type transistor without degrading performance. However, if the threshold adjustment approaches the depletion mode it is preferred that one side of the transistor be disconnected to preclude source-drain leakage when the transistor should be turned off.

An alternate switch set 65' for the Group IV range switch set 65 is shown wherein both transistors of each pair are P-type devices. In this instance the drain/source electrode most distant from the summing capacitor of one transistor of each pair must remain disconnected from the circuit. The P-type transistors in the set 65' are indicated as having reduced threshold potentials (note, since the threshold voltage of a P-type transistor is a negative value a reduced or lesser P-type threshold is actually a more positive number). For an 8 bit A/D circuit, however, these devices may have normal threshold values.

What is claimed is:

1. A flash A/D converter having a resistive ladder for establishing incrementally ascending reference potentials, a plurality of summing capacitors serially connected to respective input terminals of a like number plurality of selectively self biasing inverter circuits and a signal input terminal, said A/D converter having a plurality of switch means for alternately serially connecting respective ones of the reference potentials or input signal from said signal input terminal to respective ones of said plurality of summing capacitors, each of said plurality of switch means including at least two transistors of like type having an interconnection at one of said capacitors, one of said two transistors being connected to one of said reference potentials and the other of said two transistors being connected to said input terminal; the two transistors of ones of said plurality of switch means connected to a prescribed range of most positive reference potentials being P-type FET's precluding the capacitors connected thereto from being discharged below a predetermined first potential due to application of input signal potential to said signal input terminal less than said predetermined first potential and the two transistors of ones of said plurality of switch means connected to a prescribed range of most negative reference potentials being N-type FET's precluding the respective capacitors connected thereto from being charged above a predetermined second potential due to application of input signal potential to said input terminal greater than said predetermined second potential.

2. Switching circuitry for alternately connecting an input signal or ones of a plurality of reference potentials having incrementally increasing values to respective ones of a plurality of output terminals comprising:
   a signal input terminal;
   a plurality of terminals for applying said plurality of reference potentials;
   a plurality of output terminals;
   switch means including;
   A. A plurality of a first switch configuration each including:
      first, second, third and fourth similar N-type enhancement type FET transistors having respective first, second and control electrodes;
      means connecting the first electrodes of the first, second, third and fourth transistors to a respective one of said output terminals;
      means connecting the second electrode of the third transistors to said signal input terminal;
      means for connecting the second electrode of the first transistor to one of the reference potential terminals to which one of the more negative of the incrementally increasing reference potentials is applied, and wherein the second electrode of the second and fourth transistors remain disconnected;

B. a second switch configuration each including:
fifth, sixth, seventh and eighth similar P-type enhancement FET transistors having respective first, second and control electrodes;
means connecting the first electrodes of the fifth, sixth, seventh and eighth to a respetive one of said output terminals;
means connecting the second electrode of the fifth transistor to one of the reference potential terminals to which one of the more positive of the incrementally increasing reference potentials is applied; and wherein the second electrodes of the sixth and eighth transistors remain disconnected; and
means for applying a control signal to the control electrodes of the first, fourth, sixth and seventh transistors and a complementary control signal to the control electrodes of said second, third, fifth and eighth transistors.

3. The switching circuitry set forth in claim 2 wherein said switch means further include
a third switch configuration including:
ninth and eleventh similar P-type enhancement FET transistors and tenth and twelfth similar N-type FET transistors each having respective first, second and control electrodes;
means connecting the first electrodes of the ninth, tenth, eleventh and twelfth transistors to a respective one of said output terminals;
respective means connecting the second electrodes of the eleventh and twelfth transistors to said signal input terminal;
respective means for connecting the second electrodes of the ninth and tenth transistors to one of said reference potential terminals to which a midrange reference potential between the relatively positive and relatively negative reference potentials is applied.

4. The switching circuitry set forth in claim 3 wherein the ninth and eleventh P-type transistors have a lesser turn on potential than said fifth, sixth, seventh, and eighth transistors, and said tenth and twelfth transistors have a lesser turn on potential than the N-type transistors in said first switch configuration.

5. The switching circuitry set forth in claim 3 further including:
a fourth switch configuration similar to said first switch configuration comprised of N-type transistors having a lower turn on potential than the N-type transistors in said first switch configurations;
a fifth switch configuration similar to said second switch configuration comprised of P-type transistors having a lesser turn on potential than said fifth, sixth, seventh and eighth transistors;
wherein said fourth configuration switches are implemented for connection to a prescribed range of reference potentials between said first and third configuration switches and said fifth configuration switches are implemented for connection to a prescribed range of reference potentials between said second and third configuration switches.

6. The switching circuitry set forth in claim 5 wherein of the total number of switch sets employed in the analog to digital converter, 25 percent are of said first switch configuration, 25 percent are of said second switch configuration, 25 percent are of said third switch configuration, 12½ percent are of each of said fourth and fifth switch configuration.

7. Switching circuitry for alternately connecting an input signal or ones of a plurality of reference potentials having incrementally increasing values to respective ones of a plurality of output terminals comprising:
a signal input terminal;
a plurality of terminals for applying said plurality of reference potentials;
a plurality of output terminals;
switch means including;
A. a first switch configuration including:
first and second N-type and third and fourth P-type enhancement FET transistors each having respective first, second and control electrodes;
means for connecting the first electrodes of the first, second, third and fourth transistors to a respective one of said output terminals;
means for connecting the second electrode of the first transistor to said signal input terminal;
means for connecting the second electrode of the second transistor to one of the reference potential terminals to which one of the more negative of said reference potentials is applied, and wherein the second electrode of the third and fourth transistors remain disconnected;
B. a second switch configuration each including:
fifth, sixth, seventh and eighth similar P-type enhancement FET transistors having respective first, second and control electrodes;
means for connecting the first electrodes of the fifth, sixth, seventh and eighth to a respective one of said output terminals;
means for connecting the second electrode of the seventh transistor to said signal input terminal;
means for connecting the second electrode of the fifth transistor to one of the reference potential terminals to which one of the more positive reference potentials is applied; and wherein the second electrodes of the sixth and eighth transistors remain disconnected;
C. a third switch configuration including:
ninth and eleventh similar P-type enhancement FET transistors and tenth and twelfth similar N-type FET transistors each having respective first, second and control electrodes;
means for connection the first electrodes of the ninth, tenth, eleventh and twelfth transistors to a respective one of said output terminals;
respective means for connecting the second electrodes of the eleventh and twelfth transistors to said signal input terminal;
respective means for connecting the second electrodes of the ninth and tenth transistors to one of said reference potential terminals to which a midrange reference potential between the relatively positive and relatively negative reference potentials is applied.

8. The switching circuitry set forth in claim 3 or 7 further comprising:
a fourth switch configuration including;
thirteenth and fifteenth similar P-type enhancement transistors, and, fourteenth and sixteenth similar N-type transistors each having respective first, second and control electrodes, said fourteenth and sixteenth transistors having a lesser turnon potential than the N-type transistors in said first switch configuration;

means for connecting the first electrode of the thirteenth, fourteenth, fifteenth and sixteenth transistors to a respective one of said output terminals;

means for connecting the second electrode of the fifteenth transistor to the signal input terminal;

means for connecting the second electrode of the thirteenth transistor to one of said reference potential terminals to which are applied reference potentials in a prescribed range of reference potentials between the references potentials applied to said second and third configuration of switches are;

a fifth switch configuration including;

seventeenth and nineteenth similar N-type MOS transistors and eighteenth and twentieth similar P-type MOS transistors each having respective first, second and control electrodes; said seventeenth and nineteenth transistors having a lesser turn on potential than the N-type transistors in said first switch configuration;

means for connecting the first electrodes of the seventeeth, eighteenth, nineteenth and twentieth transistors to a respective one of said output terminals;

means for connecting the second electrode of said nineteenth transistor to said signal input terminal;

means for connecting the second electrode of the seventeenth transistor to one of said reference potential terminals to which are applied reference potentials within a prescribed range of reference potentials applied to said first and third switch configurations.

9. The switching circuitry set forth in claim 8 further including:
means for interconnecting the second electrodes of the thirteenth and fourteenth transistors;
means for interconnecting the second electrodes of the fifteenth and sixteen transistors;
means for interconnecting the second electrodes of the seventeenth and eighteenth transistors; and
means for interconnecting the second electrodes of the nineteenth and twentieth transistors.

10. The switching circuitry set forth in claim 9 wherein the turn on potential of the thirteenth, fifteenth, eighteenth and twentieth P-type transistors is less than the turn on potential of the fifth, sixth, seventh and eighth transistors.

11. The switching circuitry set forth in claim 8 wherein the turn on potential of the thirteenth, fifteenth, eighteenth and twentieth P-type transistors is less than the turn on potential of the fifth, sixth, seventh and eighth transistors.

12. The switching circuitry set forth in claim 8 wherein of the total number of switch sets employed in the analog to digital converter, 25 percent are of said first switch configuration, 25 percent are of said second switch configuration, 25 percent are of said third switch configuration, 12½ percent are of each of said fourth and fifth switch configuration.

* * * * *